United States Patent
Yamamoto et al.

[11] Patent Number: 5,925,974
[45] Date of Patent: Jul. 20, 1999

[54] PIEZOELECTRIC COMPONENT

[75] Inventors: Takashi Yamamoto, Ishikawa-ken; Shigemasa Kusabiraki, Takoaka; Toshihiko Unami, Omihachiman; Hirohide Yoshino, Toyama-ken; Tetsuo Takeshima, Toyama, all of Japan

[73] Assignee: Murata Manufacturing Co., Ltd., Kyoto, Japan

[21] Appl. No.: 08/846,287

[22] Filed: Apr. 30, 1997

[30] Foreign Application Priority Data

Aug. 6, 1996 [JP] Japan .................................... 8-224431
Feb. 5, 1997 [JP] Japan .................................... 9-038351

[51] Int. Cl.⁶ .................................................. H01L 41/08
[52] U.S. Cl. ........................................ 310/348; 310/345
[58] Field of Search ................................ 310/348, 344, 310/351, 352, 353, 345, 346; 333/189

[56] References Cited

U.S. PATENT DOCUMENTS

| | | | |
|---|---|---|---|
| 2,157,665 | 5/1939 | Hollmann | 310/315 |
| 2,636,135 | 4/1953 | Peek, Jr. | 310/345 |
| 2,998,535 | 8/1961 | Church et al. | 310/323 |
| 3,185,869 | 5/1965 | Shoor | 310/315 |
| 3,297,889 | 1/1967 | Breskend | 310/315 |
| 3,401,275 | 9/1968 | Curran et al. | 310/315 |
| 3,590,287 | 6/1971 | Berlincourt et al. | 310/366 X |
| 4,087,716 | 5/1978 | Haywang | 310/359 X |
| 4,193,009 | 3/1980 | Durley, III | 310/323 |
| 4,360,754 | 11/1982 | Toyoshima et al. | 310/366 |
| 4,398,117 | 8/1983 | St. Cyr | 310/348 |
| 4,503,352 | 3/1985 | Inoue | 333/187 X |
| 4,532,451 | 7/1985 | Inoue | 310/359 X |
| 4,542,315 | 9/1985 | Yamamoto et al. | 310/348 |
| 4,564,782 | 1/1986 | Ogawa | 333/191 X |
| 4,570,098 | 2/1986 | Tomita et al. | 310/346 |
| 4,633,120 | 12/1986 | Sato et al. | 310/328 |
| 4,642,510 | 2/1987 | Yamashita | 310/348 |
| 4,656,385 | 4/1987 | Tanaka | 310/348 |
| 4,752,712 | 6/1988 | Tomita et al. | 310/328 |
| 4,759,107 | 7/1988 | Ogawa et al. | 310/366 X |
| 4,780,639 | 10/1988 | Shirasu | 310/328 |
| 4,885,498 | 12/1989 | Wakita | 310/328 |
| 5,045,744 | 9/1991 | Ando et al. | 310/366 X |
| 5,118,982 | 6/1992 | Inoue et al. | 310/328 X |
| 5,126,618 | 6/1992 | Takahashi et al. | 310/346 |
| 5,153,477 | 10/1992 | Jomura et al. | 310/366 X |
| 5,225,731 | 7/1993 | Owen | 310/366 |
| 5,233,256 | 8/1993 | Hayashi et al. | 310/317 |
| 5,237,239 | 8/1993 | Inoue et al. | 310/328 |
| 5,241,236 | 8/1993 | Sasaki et al. | 310/358 |

(List continued on next page.)

FOREIGN PATENT DOCUMENTS 5-160459 6/1993 Japan .................................... 310/366

*Primary Examiner*—Mark O. Budd
*Attorney, Agent, or Firm*—Graham & James LLP

[57] ABSTRACT

A piezoelectric component has a substantially stronger connection between a substrate and a piezoelectric resonator and has improved electrical reliability. The piezoelectric resonator includes an insulating substrate having pattern electrodes disposed therein. A piezoelectric resonator capable of vibrating, for example in a longitudinal vibration mode is mounted on the substrate. A supporting member prepared separately as a pre-formed material member is bonded to the piezoelectric resonator at a nodal point of the resonator. A first flat surface of the supporting member is bonded to a vibrating electrode on the piezoelectric resonator by a first bonding and supporting material while a second flat surface of the supporting member is bonded to one of the pattern electrodes on the substrate by a second bonding and supporting material. The length of bonding between the piezoelectric resonator and the first bonding and supporting material along the longitudinal direction of the piezoelectric resonator is preferably set to about 25% or less of the overall length of the piezoelectric resonator. A central portion of another vibrating electrode of the piezoelectric resonator is connected to the other pattern electrode on the substrate by a conductor wire.

20 Claims, 11 Drawing Sheets

U.S. PATENT DOCUMENTS

| | | | |
|---|---|---|---|
| 5,250,870 | 10/1993 | Fenlon et al. | 310/345 |
| 5,381,067 | 1/1995 | Greenstein | 310/359 X |
| 5,438,232 | 8/1995 | Inoue et al. | 310/328 |
| 5,446,485 | 8/1995 | Usui | 347/72 |
| 5,517,073 | 5/1996 | Ohkuma | 310/315 |
| 5,523,645 | 6/1996 | Inoi | 310/328 X |
| 5,525,944 | 6/1996 | Oyama | 333/189 |
| 5,548,179 | 8/1996 | Kaida | 310/348 X |
| 5,565,824 | 10/1996 | Nagano | 333/189 |
| 5,572,082 | 11/1996 | Sokol | 310/366 |
| 5,585,687 | 12/1996 | Wakabayashi et al. | 310/366 |
| 5,596,243 | 1/1997 | Tsuru et al. | 310/348 |
| 5,596,244 | 1/1997 | Kugou et al. | 310/348 |
| 5,696,472 | 12/1997 | Kaida | 333/189 |
| 5,705,880 | 1/1998 | Shimura et al. | 310/366 |
| 5,717,365 | 2/1998 | Kaida et al. | 333/187 |

PIEZOELECTRIC COMPONENT

BACKGROUND OF THE INVENTION

1. Field of the Invention

The present invention relates generally to piezoelectric components and, more particularly, to a novel piezoelectric resonator maximizing the efficient use of mechanical vibration of a piezoelectric member and to a piezoelectric component, such as an oscillator, particularly a voltage controlled oscillator, a discriminator, or a filter, containing the novel piezoelectric resonator.

2. Description of the Related Art

FIG. 16 is a sectional view of an essential portion of a structure for supporting a piezoelectric resonator on a substrate in a conventional piezoelectric component 1 related to the present invention. The piezoelectric component 1 includes a piezoelectric resonator 2, which includes a single piezoelectric substrate 3, which has, for example, a flat block shape having rectangular major surfaces (obverse and reverse surfaces). The single piezoelectric substrate 3 is polarized along the direction of the thickness thereof, for example. Electrodes 4a and 4b are respectively provided on the obverse and reverse surfaces of the single piezoelectric substrate 3. When a signal is input between the electrodes 4a and 4b, an electric field is applied to the single piezoelectric substrate 3 along the direction of the thickness of the single piezoelectric substrate 3, and the single piezoelectric substrate 3 vibrates in the longitudinal direction.

The piezoelectric resonator 2 is supported on an insulating substrate 5 having a predetermined pattern electrode 6 on its surface. The piezoelectric resonator 2 has a nodal portion supported on the insulating substrate 5 by a mounting member 7 formed of an electroconductive adhesive or the like. The mounting member 7 is formed by applying an electroconductive adhesive to the reverse surface of the piezoelectric resonator 2 so as to extend from one end to the other end of the resonator 2 in the widthwise direction and at the center in the longitudinal direction. In this conventional piezoelectric component, the mounting member 7 is formed on the reverse surface of the piezoelectric substrate 3 by printing using a metal mask, for example. The piezoelectric resonator 2 and the insulating substrate 5 are bonded to each other via the mounting member 7. The electrode 4b on the reverse side of the piezoelectric resonator 2 and the pattern electrode 6 on the obverse surface of the insulating substrate 5 are thereby connected mechanically and electrically.

However, in the structure for supporting the piezoelectric resonator 2 on the insulating substrate 5 as shown in FIG. 16, the mounting member 7 becomes rounded, for example, by mechanical stress such as surface tension, so that the area of contact between the piezoelectric resonator 2 and the insulating substrate 5 is substantially reduced. As a result, the strength of bonding between the electrode 4b on the reverse surface of the piezoelectric resonator 2 and the pattern electrode 6 on the insulating substrate 5 is significantly reduced. Correspondingly, the electrical connection between the piezoelectric resonator 2 and the pattern electrode 6 is weak. Therefore, reduced reliability and possible failure of the piezoelectric component 1 results. Further, in the conventional supporting structure shown in FIG. 16, the thickness of the mounting member 7 is relatively small and consequently, the piezoelectric resonator 2 and the insulating substrate 5 are located very close to each other when the piezoelectric resonator 2 is supported on the insulating substrate 5. With such an arrangement, there is a risk of the insulating substrate 5 resonating with the vibration of the piezoelectric resonator 2 and consequently causing an unnecessary response in electrical characteristics of the piezoelectric resonator 2.

SUMMARY OF THE INVENTION

To overcome the above-described problems, the preferred embodiments of the present invention provide a piezoelectric component connecting a substrate and a piezoelectric resonator with a high connection strength and having improved electrical reliability.

According to a preferred embodiment of the present invention, a piezoelectric component comprises a substrate, at least one piezoelectric resonator having the shape of a substantially rectangular block and disposed on a surface of the substrate, a supporting member provided between the substrate and the piezoelectric resonator, a first bonding and supporting element provided between the piezoelectric resonator and the supporting member to bond the piezoelectric resonator and the supporting member to each other, and a second bonding and supporting element provided between the supporting member and the substrate to bond the supporting member and the substrate to each other.

According to another preferred embodiment of the present invention, there is provided a piezoelectric component comprising a substrate, at least one piezoelectric resonator disposed on a surface of the substrate, and a first bonding and supporting element provided between the substrate and the piezoelectric resonator to support the piezoelectric resonator on the supporting via a bond there between, wherein a bonding length of the first bonding supporting member along a longitudinal direction of the piezoelectric resonator is set to about 25% or less of a length of the piezoelectric resonator.

In each of the piezoelectric components according to the first and second preferred embodiments of the present invention, the piezoelectric resonator may include a base member having a substantially longitudinal shape. The base member preferably includes a structure in which a plurality of piezoelectric layers and a plurality of electrodes each positioned substantially perpendicularly to the longitudinal direction of the base member are alternately laminated.

In the piezoelectric component according to the second preferred embodiment of the present invention, the first bonding supporting element may be an elastic electroconductive adhesive.

Each of the above-described first and second bonding and supporting elements may be formed of a layer of an elastic electroconductive adhesive.

The supporting member used compatibly with the above-described first and second bonding and supporting elements may include a conductive portion for electrical conduction between the piezoelectric resonator and the substrate.

The conductive portion may be formed by forming a metal foil such as copper foil on a portion of the supporting member other than flat surfaces respectively facing the substrate and the piezoelectric resonator.

According to the preferred embodiments of the present invention, the supporting member having flat surfaces respectively facing the substrate and the piezoelectric resonator is used, so that the area of bonding between the supporting member and the piezoelectric resonator provided by the first bonding and supporting element and the area of bonding between the supporting member and the substrate provided by the second bonding and supporting element are increased relative to the bonding area in the conventional structure. The strength of connection between the substrate and the piezoelectric resonator is thereby increased. Also, since the supporting member is used, the substrate and the piezoelectric resonator are suitably spaced apart from each other when the piezoelectric resonator is supported at a predetermined position on the substrate. Further, according to the preferred embodiments of the present invention, the bonding length, i.e., the length along the longitudinal direction of the piezoelectric resonator of the portions of the piezoelectric resonator and the first bonding supporting element bonded to each other, is preferably set to about 25% or less of the length of the piezoelectric resonator, thereby preventing the bonding and supporting elements from acting as a substantial load on the piezoelectric resonator which would reduce the quality factor.

In the piezoelectric component of the preferred embodiments of the present invention, the first bonding and supporting element is used for bonding between the piezoelectric resonator and the supporting member while the second bonding and supporting element is used for bonding between the supporting member and the substrate. If each of the first and second bonding and supporting elements is formed by a layer of an elastic electroconductive adhesive, the first bonding and supporting element can support the piezoelectric resonator on the supporting member while electrically connecting the piezoelectric resonator and the supporting member, and the second bonding and supporting elements can support the supporting member on the substrate while electrically connecting the supporting member and the substrate. Also in the piezoelectric component according to the preferred embodiments of the present invention, the first and second bonding and supporting elements for bonding between the piezoelectric resonator and the substrate can support the piezoelectric resonator on the substrate while electrically connecting the piezoelectric resonator and the substrate if it is an electroconductive adhesive. Moreover, if the electroconductive adhesive layer is elastic, the bonding and supporting element can absorb a vibration leak from the piezoelectric resonator.

If the supporting member has a conductive portion formed thereon, the bonding and supporting element can establish electrical connection between the piezoelectric resonator and the substrate.

As such a conductive portion, a metal foil such as copper foil may be provided on a portion of the supporting member other than the flat surfaces facing the substrate and the piezoelectric resonator to establish electrical connection between the piezoelectric resonator and the substrate.

According to the preferred embodiments of the present invention, the area of bonding between the piezoelectric resonator and the first bonding and supporting element and the area of bonding between the substrate and the second bonding and supporting element can be suitably increased to improve the connection strength, so that the electrical connection therebetween is stabilized, thus making it possible to obtain a piezoelectric component having improved electrical reliability. Also, the supporting member having a suitable thickness is used to enable the substrate and the piezoelectric resonator to be suitably spaced apart from each other when the piezoelectric resonator is mounted on the substrate at the predetermined position, so that the substrate and the piezoelectric resonator are not disposed so close to each other as in the conventional supporting structure. By this spacing, the substrate is prevented from resonating with vibration of the piezoelectric resonator, thus preventing an unnecessary response in electrical characteristics of the piezoelectric resonator.

According to the preferred embodiments of the invention, the bonding length of the bonded portions of the piezoelectric resonator and the first bonding and supporting element along the longitudinal direction of the piezoelectric resonator is preferably set to about 25% or less of the length of the piezoelectric resonator, so that the first bonding and supporting element itself does not act as a substantial load on the piezoelectric resonator which would reduce the quality factor.

The first and second bonding and supporting elements are arranged for bonding between the piezoelectric resonator and the supporting member and for bonding between the supporting member and the substrate and are preferably formed of elastic electroconductive adhesive layers, thereby preventing a vibration leak from the piezoelectric resonator. Also in the piezoelectric component according to the preferred embodiments of the invention, the first bonding and supporting element is arranged for bonding between the piezoelectric resonator and the substrate and is formed of an elastic electroconductive adhesive, thereby preventing a vibration leak from the piezoelectric resonator. That is, the substrate is prevented from resonating with vibration of the piezoelectric resonator. Thus, unnecessary response in electrical characteristics of the piezoelectric resonator are prevented more reliably.

Further, a conductive portion is provided on the supporting member to enable, for example, a predetermined pattern electrode on the substrate and a predetermined electrode of the piezoelectric resonator to be electrically connected to each other even if the supporting member is formed of a nonconductor.

These and other elements, features, and advantages of the preferred embodiments of the present invention will be apparent from the following detailed description of the preferred embodiments of the present invention, as illustrated in the accompanying drawings.

BRIEF DESCRIPTION OF THE DRAWINGS

FIG. 3A is a perspective view of a mother substrate for the piezoelectric vibrator element with a supporting member bonded to the mother substrate;

FIG. 3B is an enlarged perspective view of the piezoelectric vibrator element with the supporting member obtained by cutting the mother substrate along the double-dot-dash lines shown in FIG. 3A and having conductors formed on its side surfaces;

FIG. 11A is a perspective view of a supporting member mother substrate with metal foil formed on two major surfaces of the mother substrate;

FIG. 11B is an enlarged perspective view of the supporting member obtained by cutting the mother substrate along the double-dot-dash lines shown in FIG. 11A and having conductors formed on its side surfaces;

DETAILED DESCRIPTION OF PREFERRED EMBODIMENTS

A piezoelectric component which is used as an oscillator and which represents a first preferred embodiment of the present invention will be described.

Figure 1:
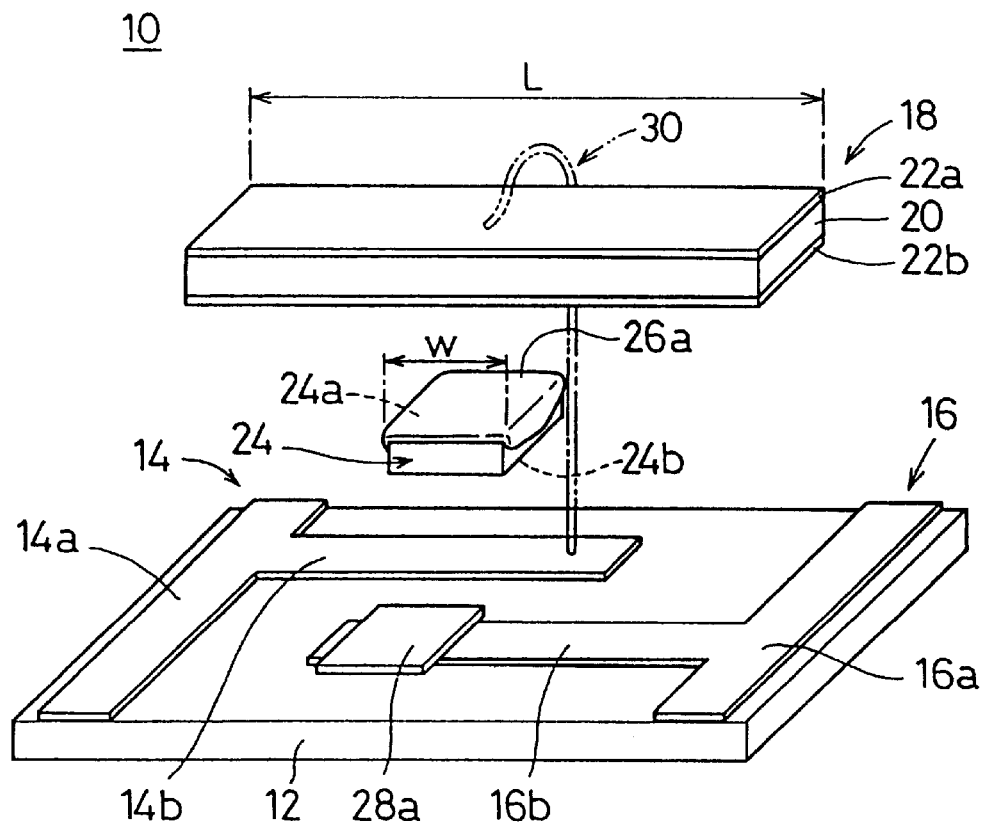
FIG. 1 is an exploded perspective view of a piezoelectric component which represents a preferred embodiment of the present invention.

Referring to FIG. 1, a piezoelectric component 10 includes an insulating substrate 12 preferably made of alumina or the like and preferably having a substantially rectangular plate shape. Two pattern electrodes 14 and 16, for example, are disposed on one of two major surfaces of the insulating substrate 12 (obverse surface as viewed in FIG. 1) and are spaced apart from each other. The pattern electrode 14 is preferably formed of a line electrode 14a which extends substantially straight along one of the shorter sides of the obverse surface of the insulating substrate 12 from one end to the other end in the widthwise direction of the insulating substrate 12, and a line electrode 14b which extends substantially straight in the longitudinal direction of the insulating substrate 12 from a position in the vicinity of one longitudinal direction end of the line electrode 14a.

The pattern electrode 16 is preferably formed of a line electrode 16a which extends substantially straight along the other shorter side of the obverse surface of the insulating substrate 12 from one end to the other end in the widthwise direction of the insulating substrate 12, and a line electrode 16b which extends substantially straight in the longitudinal direction of the insulating substrate 12 from a position in the vicinity of one longitudinal direction end of the line electrode 16a.

The pattern electrodes 14 and 16 have extensions formed to extend to positions on the reverse surface of the insulating substrate 12 in a roundabout fashion, although they are not illustrated.

A piezoelectric vibrator element 18 used as a piezoelectric resonator is provided on the obverse side of the insulating substrate 12. The piezoelectric vibrator element 18 includes a piezoelectric substrate 20 which is, for example, a piezoelectric ceramic member having a flat block shape having substantially rectangular major surfaces (obverse and reverse surfaces). A vibrating electrode 22a is disposed, for example, on the entire obverse surface of the piezoelectric substrate 20 while a vibrating electrode 22b is disposed on the entire reverse surface of the piezoelectric substrate 20. For example, this piezoelectric vibrator element 18 vibrates in a longitudinal vibration mode and is used a piezoelectric resonator.

This piezoelectric vibrator element 18 is attached to the insulating substrate 12 at a predetermined position by a supporting member 24 and first and second bonding and supporting elements 26, 28 preferably comprising first and second elastic adhesive layers interposed therebetween.

For example, the supporting member 24 preferably has a small flat block shape having substantially rectangular major surfaces, and which is preferably made of an epoxy resin or the like.

The supporting member 24 preferably has a pair of flat opposite surfaces 24a and 24b (major surfaces). The supporting member 24 is placed between the piezoelectric vibrator element 18 and the insulating substrate 12 so that the flat surface 24a faces the reverse surface of the piezoelectric vibrator element 18 while the other flat surface 24b faces the obverse surface of the insulating substrate 12. Specifically, the supporting member 24 is preferably positioned substantially at the center of the piezoelectric vibrator element 18 in the longitudinal direction, as shown in FIG. 1.

An electroconductive adhesive 26a is prepared to function as a first bonding and supporting element by mixing a filler of an electroconductive material such as silver in an elastic thermosetting resin such as a silicone or epoxy resin and adhered to the flat surface 24a which is the upper surface of the supporting member 24, thereby forming the first electroconductive adhesive layer 26. The flat surface 24a of the supporting member 24 is bonded by the first electroconductive adhesive layer 26 preferably to a vibration node region of the piezoelectric vibrator element 18, i.e., a portion at the center in the longitudinal direction of the piezoelectric vibrator element 18. More specifically, the flat surface 24a of the supporting member 24 is preferably bonded to a portion of the vibrating electrode 22b of the piezoelectric vibrator element 18 substantially corresponding to the center in the longitudinal direction. The bonding length W, i.e., the length along the longitudinal direction of the piezoelectric vibrator 18 of the portion of the first electroconductive adhesive layer 26 functioning as the first bonding and supporting element and the portion of the piezoelectric resonator 18 bonded to each other, is preferably set to about 25% or less of the overall length L of the piezoelectric vibrator element 18. In this preferred embodiment, the piezoelectric vibrator element 18 is preferably formed so that, for example, its overall length L is approximately 4.0 mm, its width is approximately 0.6 mm and its thickness is approximately 0.4 mm.

On the other hand, on the obverse surface of the insulating substrate 12, the second electroconductive adhesive layer 28 preferably formed of an electroconductive adhesive 28a functions as the second bonding and supporting element and is preferably disposed at the position corresponding to a substrate portion on which the piezoelectric vibrator element 18 is mounted. In this preferred embodiment, the electroconductive adhesive 28a is adhered to a longitudinal direction end portion of the line electrode 16b of the pattern electrode 16 on the insulating substrate 12 surface. As electroconductive adhesive 28a, preferably the same electroconductive adhesive as the electroconductive adhesive 26a forming the above-described first bonding and supporting element is used.

The other flat surface 24b, i.e., the lower end surface, of the supporting member 24 bonded to the piezoelectric vibrator element 18 is adhered to the electroconductive adhesive 28a which is adhered to the insulating substrate 12 surface. The vibrating electrode 22a of the piezoelectric vibrator element 18 is connected to the pattern electrode 14 on the insulating substrate 12 preferably by a conductor wire 30 or the like. The conductor wire 30 is connected between a longitudinal direction central portion of the vibrating electrode 22a and a longitudinal direction end portion of the line electrode 14b of the pattern electrode 14.

Further, a metallic cap (not shown) or the like is placed on the insulating substrate 12. To prevent the metal cap from being short-circuited to the pattern electrodes 14 and 16, an insulating resin is preferably applied to the insulating substrate 12 and the pattern electrodes 14 and 16 in advance. By capping with the metallic cap, the manufacture of the piezoelectric component 10 is completed. In this piezoelectric component 10, the portions (not shown) of the pattern electrodes 14 and 16 arranged to extend from edges of the insulating substrate 12 to positions on the reverse surface of the insulating substrate 12 in a roundabout fashion are used as input/output terminals for connection to an external circuit.

An example of the method of making the supporting member 24 of this preferred embodiment will now be described with reference mainly to FIGS. 1 and 3.

Figure 3A:
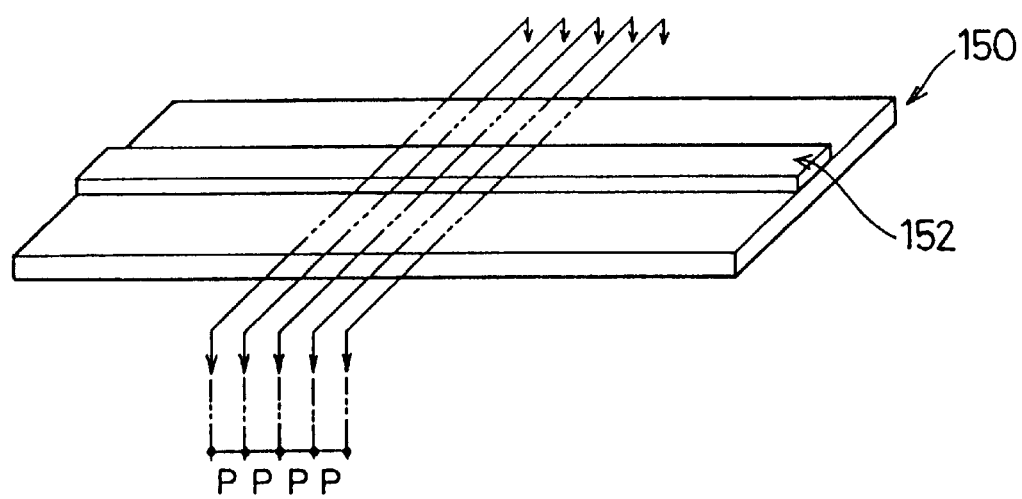
FIGS. 3A and 3B are diagrams showing an example of the method of attaching a supporting member to a piezoelectric vibrator element, applied to the piezoelectric component shown in FIGS. 1 and 2.
Figure 3B:
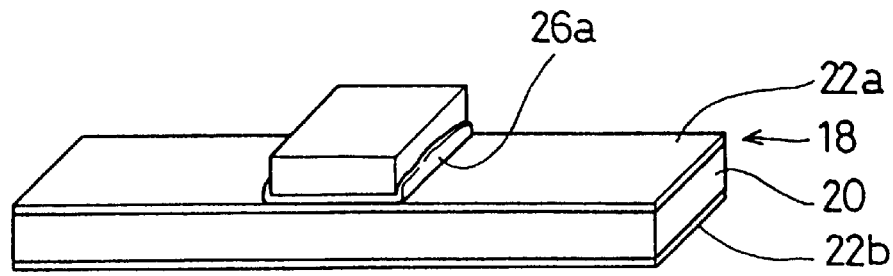

First, a mother substrate 150 for forming the piezoelectric vibrator element 18 is prepared to have, for example, a length of approximately 30 mm, a width of approximately 4 mm and a thickness of approximately 0.4 mm. A pre-formed material element 152 for defining the supporting member 24, having a predetermined size in length, width and thickness and made by being cut off from a mother substrate (not shown) for forming the supporting member 24 separately from the mother substrate 150, is bonded to a portion of one surface of the mother substrate 150 corresponding to the center in the widthwise direction of the mother substrate 150. For example, the pre-formed material element 152 is preferably formed so as to have a length of about 30 mm, a width of about 0.8 mm and a thickness of about 0.25 mm. The pre-formed material element 152 is bonded to the central portion of the mother substrate 150 by electroconductive adhesive 26a, as shown in FIG. 3A. In this preferred embodiment, the width of the pre-formed material element 152 for the supporting member 24 is preferably set to about 0.8 mm, which is approximately 20% of the overall length of the piezoelectric vibrator element 18.

Thereafter, the mother substrate 150 is cut along a plurality of planes preferably with a pitch p of about 0.6 mm corresponding to the width of the piezoelectric vibrator element 18, as indicated by the double-dot-dash lines in FIG. 3A. The mother substrate 150 is thereby cut into pieces each having the structure shown in FIG. 3B, thus making the piezoelectric vibrator element 18 with the supporting member 24. That is, to a portion of one major surface of the piezoelectric vibrator element 18 corresponding to the center in the longitudinal direction of the piezoelectric vibrator element 18 (at a nodal point), one of the opposite flat surfaces, i.e., flat surface 24a, of the supporting member 24 is bonded by the first electroconductive adhesive layer 26 of the electroconductive adhesive 26a (first bonding and supporting element).

In the piezoelectric component 10 of this preferred embodiment, the supporting member 24 is formed and bonded to the portion of the piezoelectric vibrator element 18 corresponding to the center in the longitudinal direction and to the line electrode 16b on the insulating substrate 12 by the electroconductive adhesives 26a and 28a. Certain spaces are thereby maintained between the ends of the piezoelectric vibrator element 18 and the insulating substrate 12, so that vibration of the piezoelectric vibrator element 18 is not noticeably or significantly impeded by the insulating substrate 12. Also, the central portion of the piezoelectric vibrator element 18 corresponding to a node is preferably fixed on the supporting member 24 and has a connection to the conductor wire 30. Therefore, longitudinal vibration excited in the piezoelectric vibrator element 18 is not attenuated.

Specifically, in the piezoelectric component 10 of this preferred embodiment, the piezoelectric vibrator element 18 used as a piezoelectric resonator is supported at a predetermined position on the insulating substrate 12 by the supporting member 24 and by being bonded by electroconductive adhesives 26a and 28a adhered to the flat surfaces 24a and 24b of the supporting member 24. In this bonding, the flat surface 24a of the supporting member 24 is bonded to the piezoelectric vibrator element 18 by the electroconductive adhesives 26a while the flat surface 24b of the supporting member 24 is bonded to the insulating substrate 12 by the other electroconductive adhesives 28a. Therefore, the area of bonding between the supporting member 24 and the piezoelectric vibrator element 18 and between the supporting member 24 and the insulating substrate 12 is increased relative to, for example, that in the conventional arrangement shown in FIG. 13.

As a result, the strength of connection between the insulating substrate 12 and the piezoelectric vibrator element 18 is improved and the electrical connection between the insulating substrate 12 and the piezoelectric vibrator element 18 is stabilized, thus obtaining the piezoelectric component 10 having improved electrical reliability.

Because a pre-formed material element which is separately and previously made is used as the supporting member 24, the supporting member 24 can have a suitable thickness such that the insulating substrate 12 and the piezoelectric vibrator element 18 can be suitably spaced apart from each other when the piezoelectric vibrator element 18 is bonded to and supported on the insulating substrate 12 at the predetermined position by the electroconductive adhesives 26a and 28a. Thus, the distance between the insulating substrate 12 and the piezoelectric vibrator element 18 can be set to a more suitable value in the piezoelectric component 10 of the preferred embodiments of the present invention than in the conventional piezoelectric component, thereby preventing resonance of the insulating substrate 12 with vibration of the piezoelectric vibrator element 18. Consequently, it is possible to prevent occurrence of an unnecessary response in electrical characteristics of the piezoelectric vibrator element 18.

Moreover, since a pre-formed material element which is separately made previously is used as the supporting member 24, the supporting member 24 can be formed accurately into the shape of the desired size and can be made at a lower cost. Also, the electronic component can be made stable in electrical characteristics by selecting the kind, quality and size of the material 24 without causing resonance with the piezoelectric vibrator element and a reduction in quality factor.

Further, in the piezoelectric component 10 of this preferred embodiment, the bonded structure is arranged so that the bonding length of the bonded portions of the piezoelectric vibrator element 18 and the first bonding and supporting element, i.e., the first adhesive layer 26, along the longitudinal direction of the piezoelectric vibrator element 18, is preferably not larger than about 25% of the overall length of the piezoelectric vibrator element 18, and so that the area of contact therebetween is sufficiently large. Therefore, the first bonding and supporting member, i.e., the first electroconductive layer 26, and the supporting material 24 do not act as a load on the piezoelectric vibrator element 18 which would reduce the quality factor.

Figure 4:
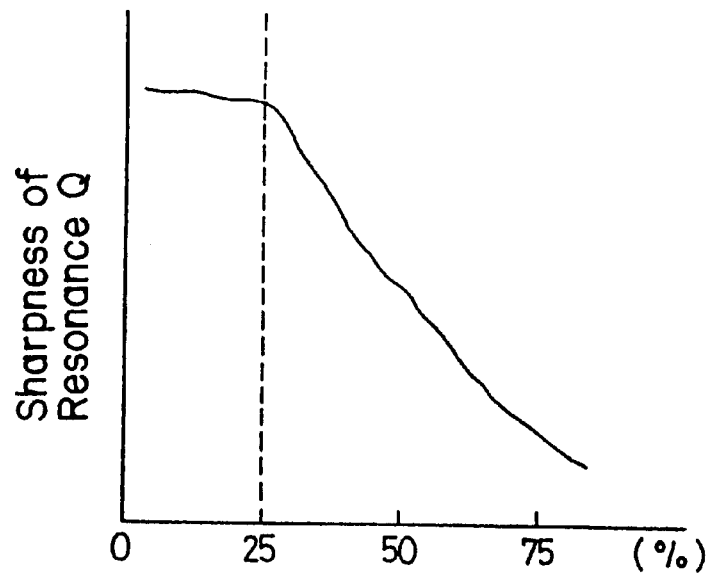
FIG. 4 is a graph showing the relationship between the sharpness of resonance and the ratio of the length of the bonded portions of the piezoelectric vibrator element and the supporting member to the overall length of the piezoelectric vibrator element.

Research conducted by the inventors of the present invention revealed the following. If the length (overall length) of the piezoelectric vibrator element 18 in this piezoelectric component 10 is L and the length along the longitudinal direction of the piezoelectric vibrator element 18 of the portion of the first bonding and supporting element, i.e., the first electroconductive adhesive layer 26 and the portion of the piezoelectric vibrator element 18 bonded to each other is W, then the relationship between the quality factor and the ratio W/L is as shown in FIG. 4. That is, the quality factor is reduced when the ratio W/L about exceeds 25%. When the ratio W/L is preferably not higher than about 25%, the quality factor is not reduced.

Figure 5:
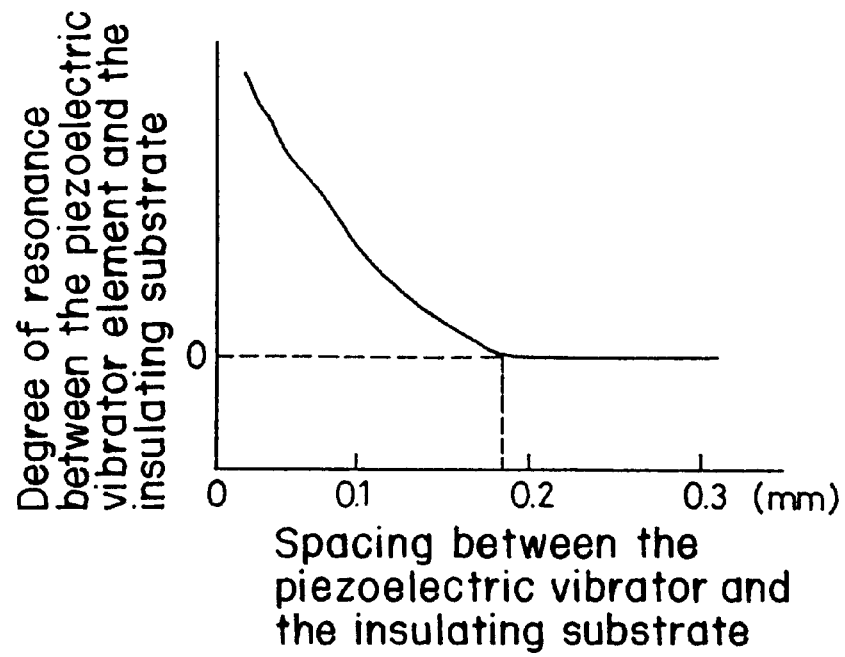
FIG. 5 is a graph showing the relationship between the spacing between the piezoelectric vibrator element and the insulating substrate and the degree of resonance between the piezoelectric vibrator element and the insulating substrate.

In general, in a piezoelectric component using a piezoelectric vibrator element, the substrate is liable to resonate with vibration of the piezoelectric vibrator element if the distance between the piezoelectric vibrator element and the substrate is small, that is, the piezoelectric vibrator element and the substrate are disposed excessively close to each other. The inventors of the present invention have discovered that, with respect to the piezoelectric component 10 of this preferred embodiment, the degree of resonance between the piezoelectric vibrator element 18 and the insulating substrate 12 is increased so that resonance can occur easily therebetween if the distance G between the piezoelectric vibrator element 18 and the insulating substrate 12 is in the range below about 0.2 mm, as shown in FIG. 5.

In the piezoelectric component 10 of this preferred embodiment, a vibration leak from the piezoelectric vibrator element 18 can be absorbed by the first and second elastic electroconductive adhesive layers 26 and 28 functioning as the first and second bonding and supporting elements. That is, resonance of the insulating substrate 12 with the vibration of the piezoelectric vibrator element 18 can be limited to reduce the undesirable effect of causing an unnecessary response in electrical characteristics of the piezoelectric vibrator element 18.

The piezoelectric component 10 of this preferred embodiment is used as, for example, an oscillator or discriminator by being mounted on a circuit board together with an integrated circuit or the like. The piezoelectric component 10 constructed as described above is enclosed tightly and protected by the metallic cap (not shown) and can therefore be used as a chip component mountable by reflow soldering or other suitable mounting method.

Figure 2:
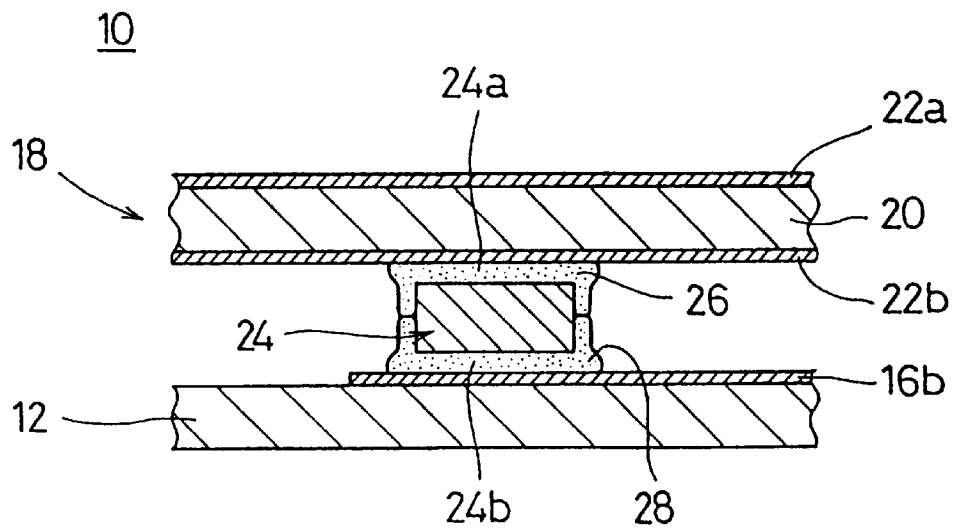
FIG. 2 is an enlarged fragmentary sectional view of an essential portion of the piezoelectric component shown in FIG. 1.
Figure 6:
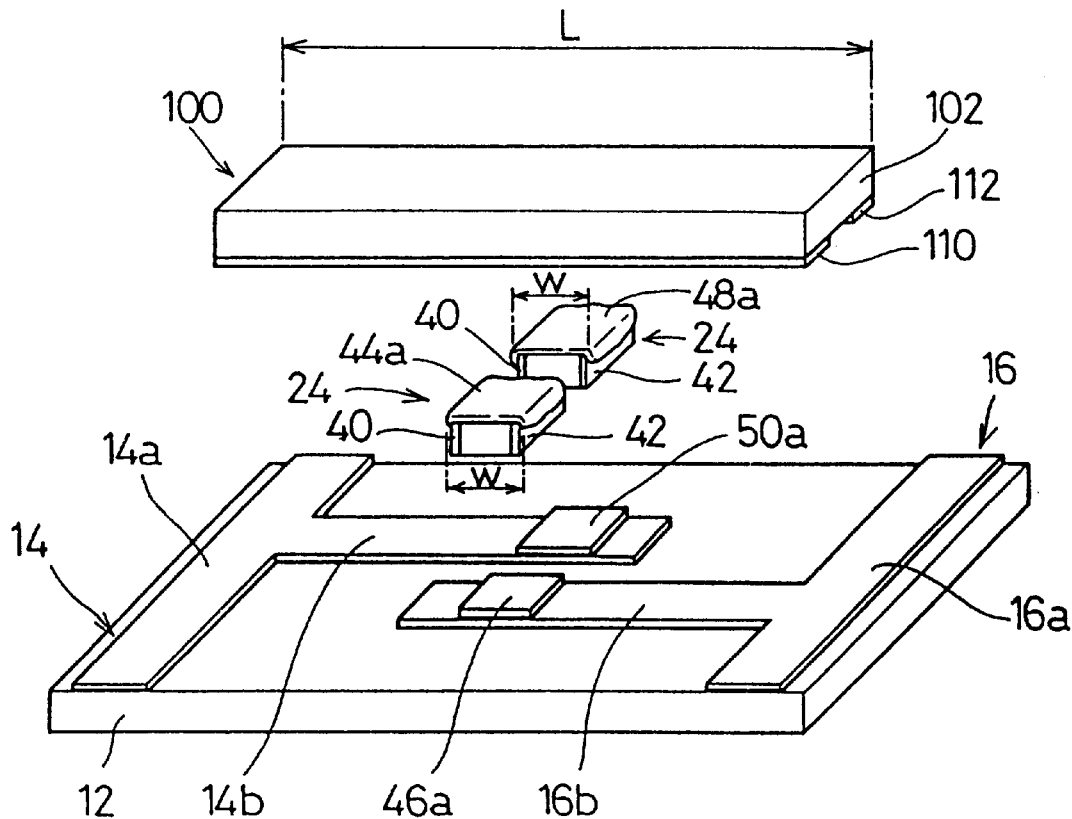
FIG. 6 is an exploded perspective view of a piezoelectric component which represents a second preferred embodiment of the present invention.
Figure 7:
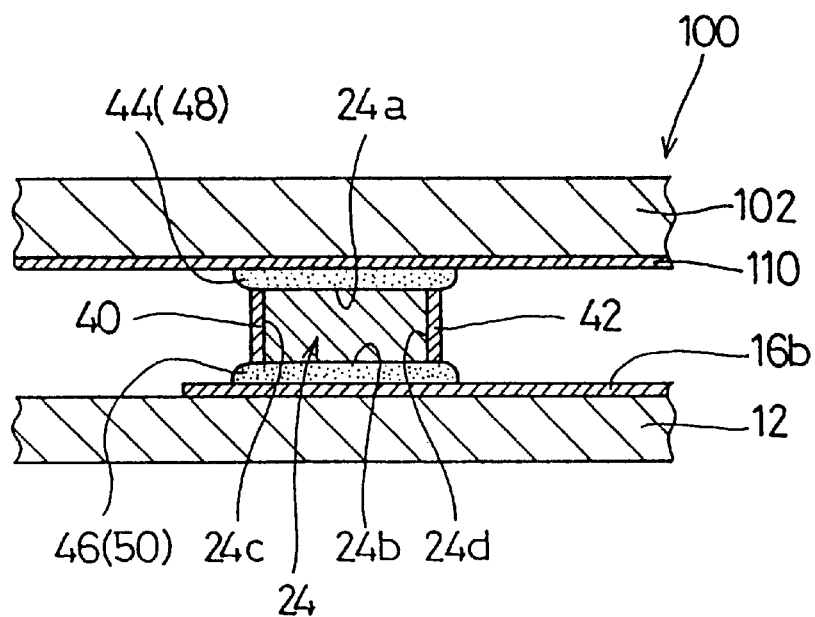
FIG. 7 is an enlarged fragmentary sectional view of an essential portion of the piezoelectric component shown in FIG. 6.

FIG. 6 is an exploded perspective view of a piezoelectric component 10 which represents a second preferred embodiment of the present invention, and FIG. 7 is an enlarged sectional view of an essential portion of the electronic component 10 shown in FIG. 6. The piezoelectric component 10 described below is used as, for example, a discriminator, a voltage controlled oscillator or a filter. This piezoelectric component differs from the above-described piezoelectric component 10 in that conductors 40 and 42 for electrically connecting first bonding and supporting element disposed on the upper surface of a supporting member 24 and the second bonding and supporting element disposed on the lower surface of the supporting member 24 are formed on side surfaces of the supporting member 24. In FIGS. 6 and 7, portions or members indicated by the same reference characters or having the same names as those of the preferred embodiment shown in FIGS. 1 to 3 have the same or similar structures, and the construction of such common portions will not specially be described.

The piezoelectric component 10 of the preferred embodiment shown in FIG. 6 and 7 includes an insulating substrate 12. Predetermined pattern electrodes 14 and 16 are disposed on the obverse surface of the insulating substrate 12. A piezoelectric vibrator element 100 having a laminated structure is bonded to and supported on the insulating substrate 12 at a predetermined position.

Figure 8:
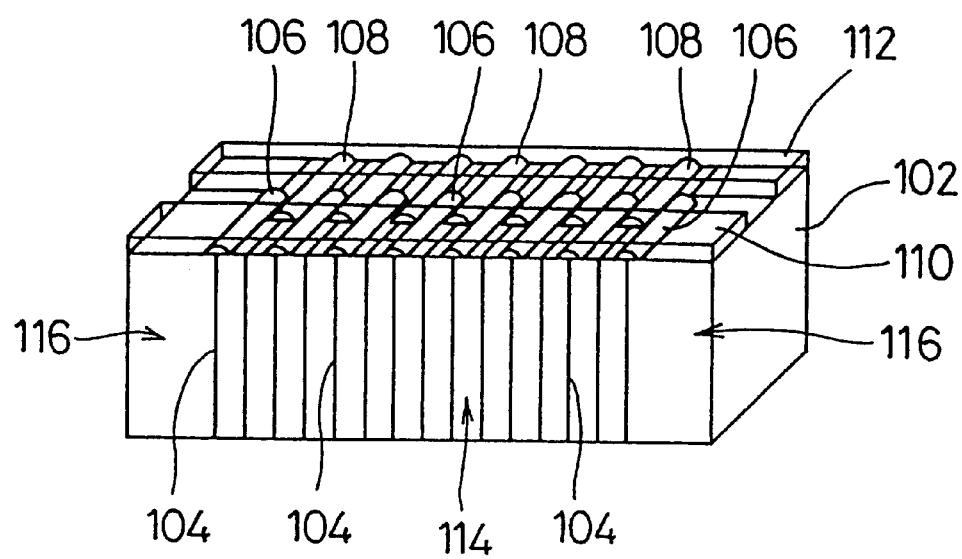
FIG. 8 is a diagram of an example of the piezoelectric vibrator element used in the piezoelectric component shown in FIG. 6.

The piezoelectric vibrator element 100 includes a base member 102 preferably having a longitudinal shape, as shown in FIG. 8. The base member 102 is formed of a piezoelectric material. A plurality of electrodes 104 are formed in the base member 102 by being arranged so that their major surfaces are substantially perpendicular to the longitudinal direction of the base member 102. Thus, the base member 102 has a laminated structure in which a plurality of piezoelectric layers and electrodes 104 are alternately laminated. The piezoelectric layers are polarized along the longitudinal direction of the base member 102 in such a manner that the pair of the piezoelectric layers on the opposite sides of each internal electrode 104 are polarized in opposite directions.

Strips of insulating film 106 and strips of insulating film 108 are respectively arranged in two rows on one side surface of the base member 102. The strips of insulating film 106 are formed so that the electrodes 104 exposed in the side face of the base member 102 are alternately covered and left uncovered with the insulating film 106. The strips of insulating film 108 are formed so as to cover the electrodes 104 not covered with the insulating film 106. External electrodes 110 and 112 are formed over the thus-formed two rows of the strips of insulating films 106 and 108. The electrodes 104 not covered with the insulating film 106 are connected to the external electrode 110 while the electrodes 104 not covered with the insulating film 108 are connected to the external electrode 112.

In the piezoelectric vibrator element 100, the piezoelectric layers in a central section of the base member 102 are polarized. When an electric field is applied between each pair of the electrodes 104 in the central section, the piezoelectric layers are preferably made piezoelectrically active. On the other hand, two end sections of the base member 102 at the opposite ends in the longitudinal direction are preferably not polarized, and no electrodes are disposed in the end sections. Therefore, the end sections are not made piezoelectrically active. Thus, the central section of the base member 102 is defined as an active section 114 which is piezoelectrically active while the two end sections of the base member 102 are defined as inactive sections 116 which are piezoelectrically inactive.

When a signal is applied between the two external electrodes, an AC electric field in the longitudinal direction of the base member 102 is applied to each of the piezoelectric layers in the active section 114 to generate an expansion and contraction drive force in the piezoelectric layer, thereby exciting vibration in the longitudinal fundamental mode in the entire base member 102.

Figure 9:
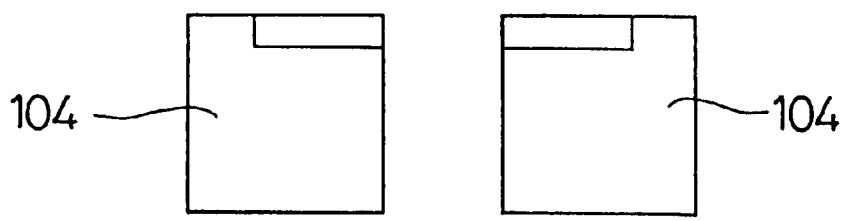
FIG. 9 is a plan view of piezoelectric layers and electrodes in another example of the piezoelectric vibrator element used in the piezoelectric component shown in FIG. 6.
Figure 10:
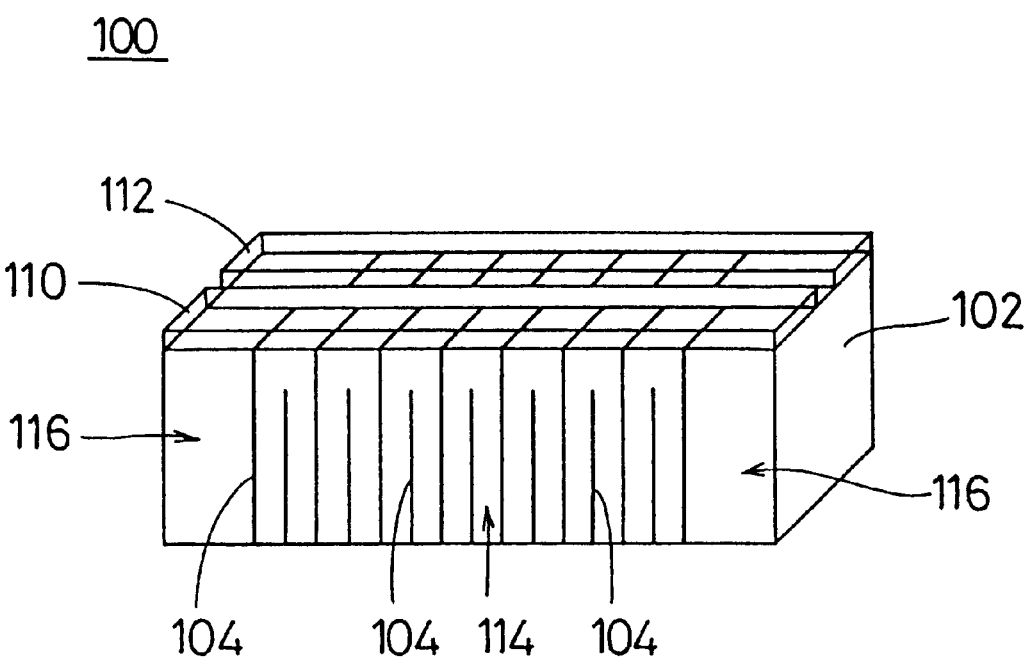
FIG. 10 is a diagram of a piezoelectric vibrator element using a base member formed by laminating the piezoelectric layers and the electrodes shown in FIG. 9.

The piezoelectric layers and electrodes 104 may alternatively be formed in such a manner that, as shown in FIG. 9, the electrodes 104 have lead-out portions formed alternately at one end and at the other end and extending to end surfaces of the piezoelectric layers facing in one direction. In one side surface of the laminated body 102 formed by laminating the piezoelectric layers and electrodes 104 in this manner, two rows of electrode 104 portions are exposed, as shown in FIG. 10. External electrodes 110 and 112 are formed over exposed portions of the electrodes 104. The external electrode 104 are thereby connected alternately to the external electrodes 110 and 112.

In this piezoelectric component 10, conductors 40 and 42 are preferably formed of a metal foil, e.g., copper foil on the entire areas of a pair of opposite side surfaces other than the opposite flat surfaces 24a and 24b, i.e., flat surfaces 24c and 24d of the supporting member 24.

Figure 11A:
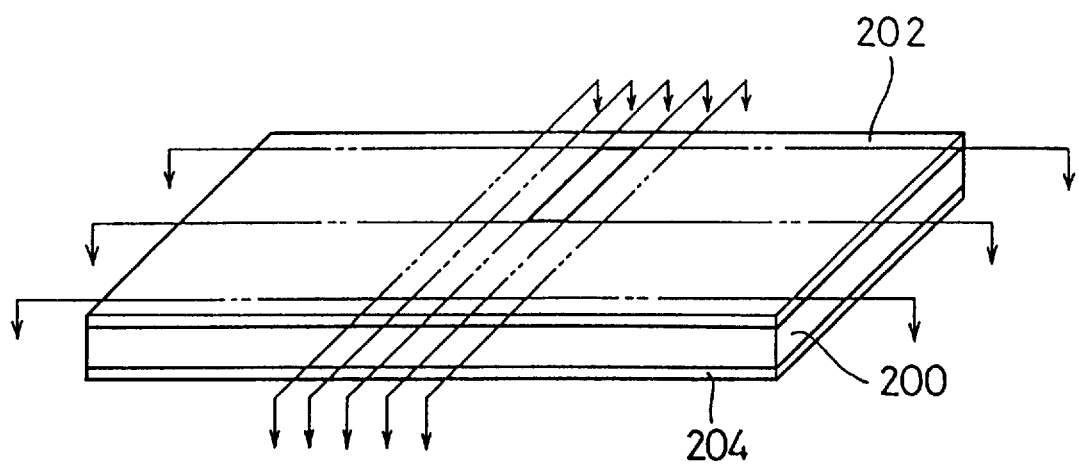
FIGS. 11A and 11B are diagrams showing an example of the method of mounting a conductor formed on a supporting member used in the piezoelectric component shown in FIGS. 6 and 7.

An example of the method of making supporting members 24 having conductors 40 and 42 will be described with reference mainly to FIGS. 6 and 11.

Figure 11B:
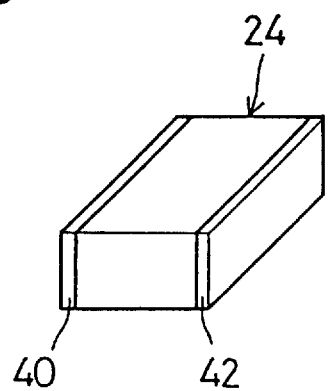

First, a mother substrate 200 for forming supporting member 24, made of an epoxy resin material or the like and having a predetermined size, is prepared. Next, foils 202 and 204 of a metal, e.g., copper, are preferably formed to cover entire areas of two major surfaces of the mother substrate 200. The mother substrate 200 with metal foils 202 and 204 is cut, for example, along a group of planes spaced a predetermined distance apart from each other in the widthwise direction and along another group of planes spaced a predetermined distance apart from each other in the longitudinal direction, as indicated by the double-dot-dash lines in FIG. 11A. Supporting members 24 each having a predetermined size and having conductors 40 and 42 formed of a metal foil on its side surfaces, as shown in FIG. 11B, for example, are thereby made.

Electroconductive adhesives 44a and 48a are adhered to flat surfaces 24a of the supporting members 24. On the other hand, electroconductive adhesive layers 46a and 50a are adhered to the line electrode 16b of the pattern electrode 16 and to the line electrode 14b of the pattern electrode 14, respectively.

The upper surfaces of the supporting members 24 are bonded to portions of the reverse surface of the piezoelectric vibrator element 100 corresponding to the center in the longitudinal direction of the piezoelectric vibrator element 100 (a nodal point) by electroconductive adhesives 44a and 48a. The electroconductive adhesive 44a adheres to the external electrode 110 of the piezoelectric vibrator element 100 while the electroconductive adhesive 50a adheres to the other external electrode 112.

Also, the lower surfaces of the supporting members 24 are bonded to the insulating substrate 12 at predetermined positions by electroconductive adhesives 46a and 50a. The lower surfaces of the supporting members 24 opposite from electroconductive adhesives 44a and 48a are adhered to electroconductive adhesives 46a and 50a, respectively.

That is, in this piezoelectric component 10, the external electrode 110 of the piezoelectric vibrator element 100 is mechanically and electrically connected to the pattern electrode 16 on the insulating substrate 12 by the first electroconductive adhesive layer 44 (first supporting means), the conductors 40 and 42 and the second electroconductive adhesive layer 46 (second supporting means). Also, the external electrode 112 of the piezoelectric vibrator element 100 is mechanically and electrically connected to the pattern electrode 14 on the insulating substrate 12 by the first electroconductive adhesive layer 48 (first bonding and supporting element), the conductors 40 and 42 and the second electroconductive adhesive layer 50 (second bonding and supporting element).

In this preferred embodiment, the bonded structure is arranged so that the bonding length along the longitudinal direction of the piezoelectric resonator 100 is not larger than about 25% of the overall length of the piezoelectric resonator 100, and so that the bonding area is sufficiently large, as is that in the above-described preferred embodiment.

In the piezoelectric component 10 of this preferred embodiment, conductors 40 and 42 are respectively disposed on two side surfaces 24c and 24d of the supporting member 24. However, a conductor, used instead of conductors 40 and 42, may be disposed on only one of the two side surfaces.

This preferred embodiment uses the same structure for supporting the piezoelectric vibrator element 100 on the insulating substrate 12 as that in the first preferred embodiment and is, therefore, essentially equivalent to the above-described first preferred embodiment in terms of operation and advantage.

Figure 12:
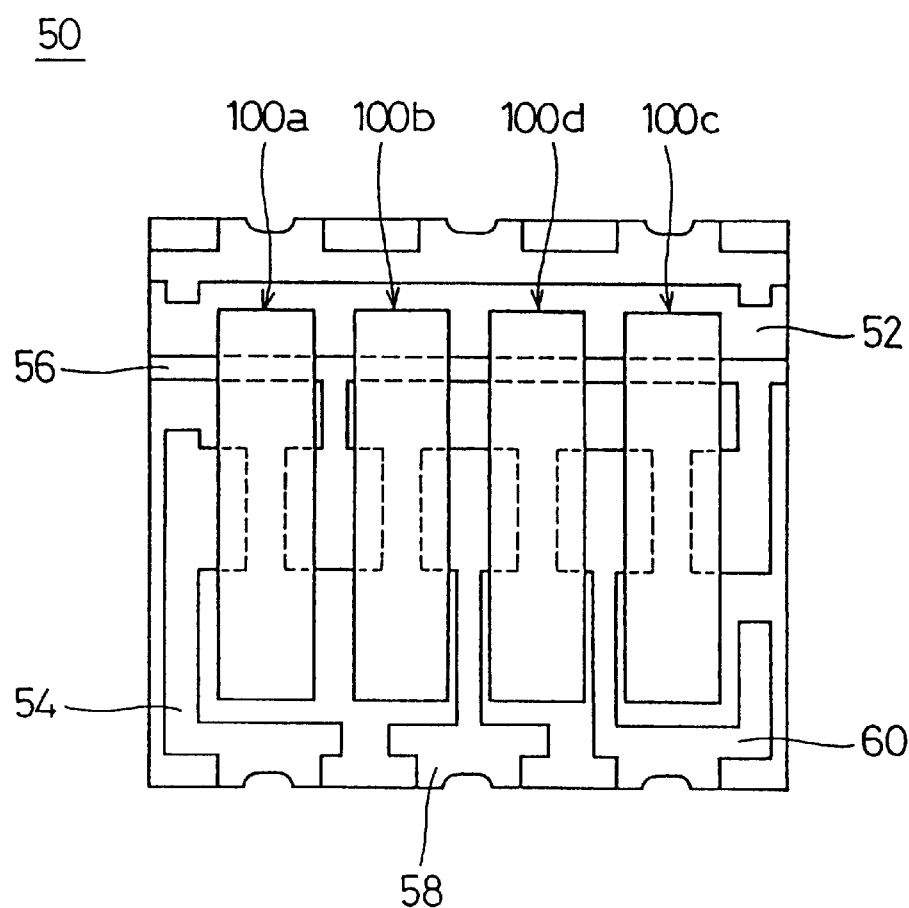
FIG. 12 is a plan view of an essential portion of a piezoelectric component which represents a third preferred embodiment of the present invention.
Figure 13:
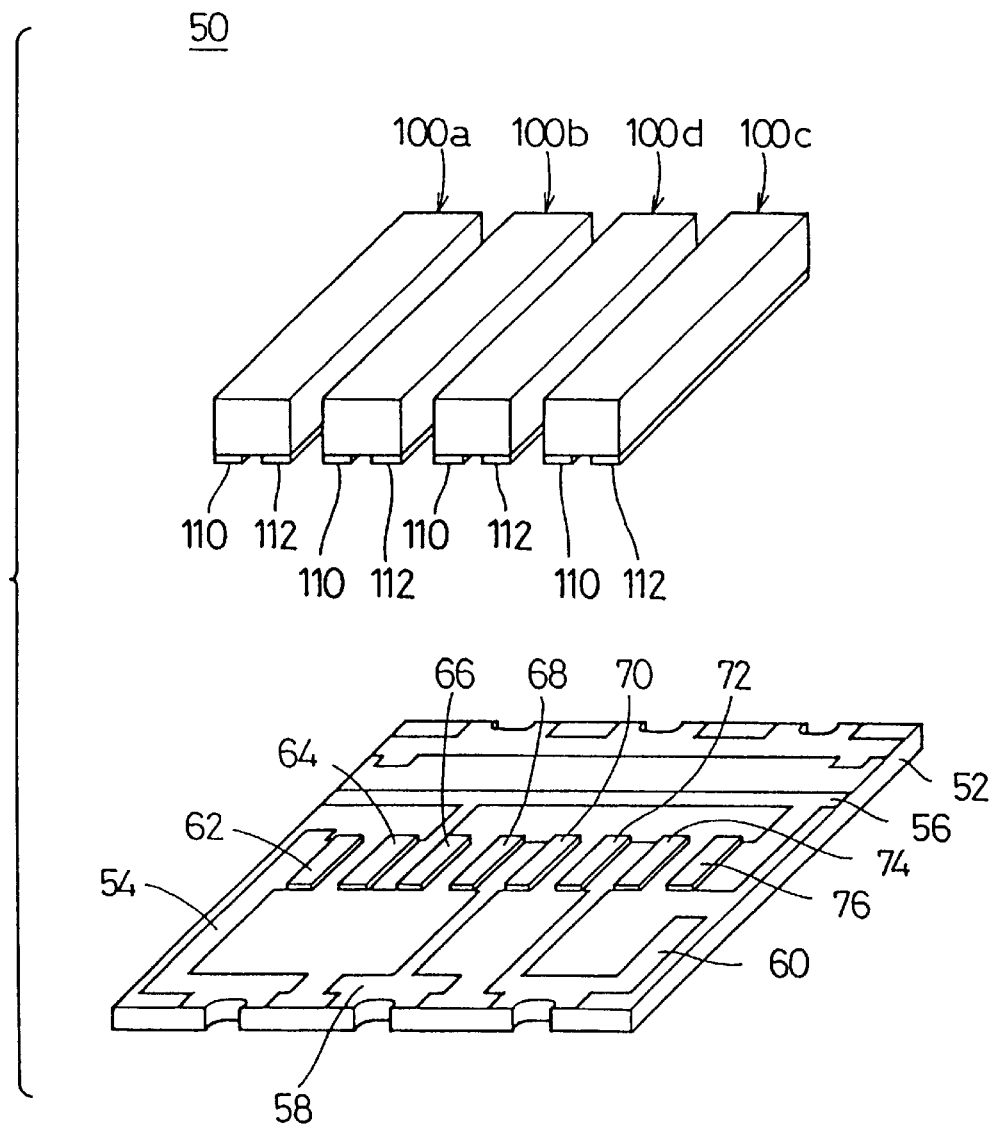
FIG. 13 is an exploded perspective view of the essential portion of the piezoelectric component shown in FIG. 12.
Figure 14:
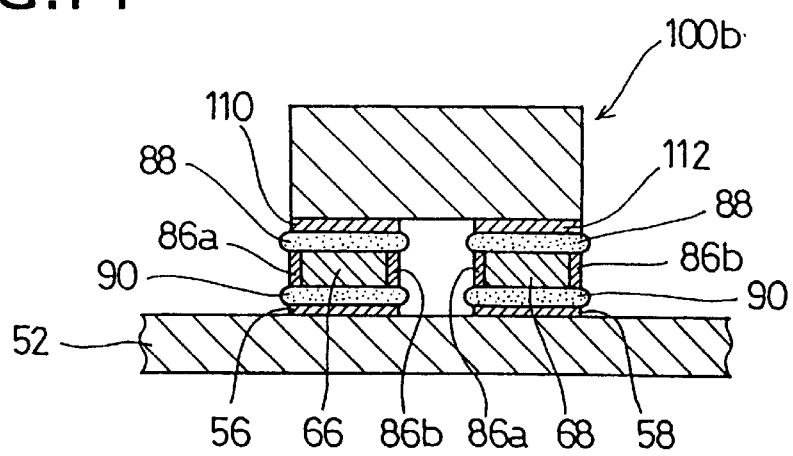
FIG. 14 is an enlarged fragmentary sectional view of the portion of the piezoelectric component shown in FIGS. 12 and 13.
Figure 15:
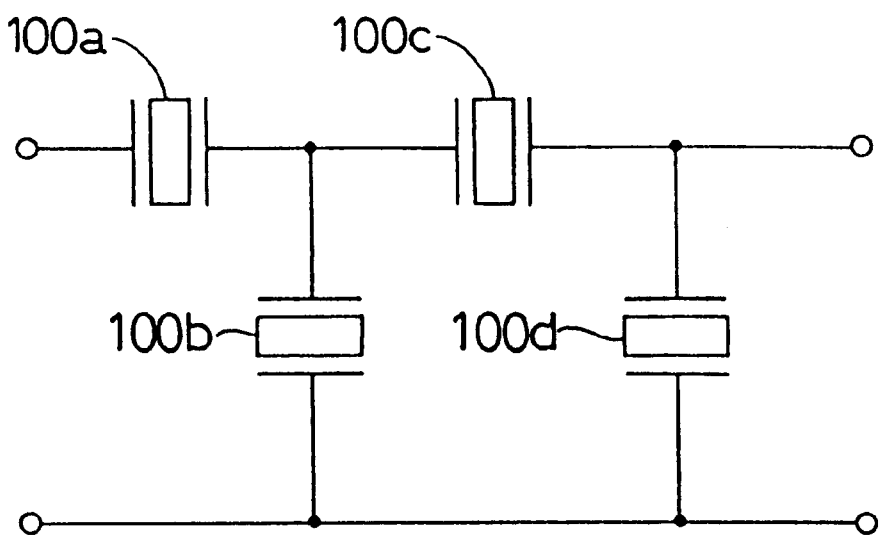
FIG. 15 is a circuit diagram of the piezoelectric component shown in FIGS. 12, 13 and 14.
Figure 16:
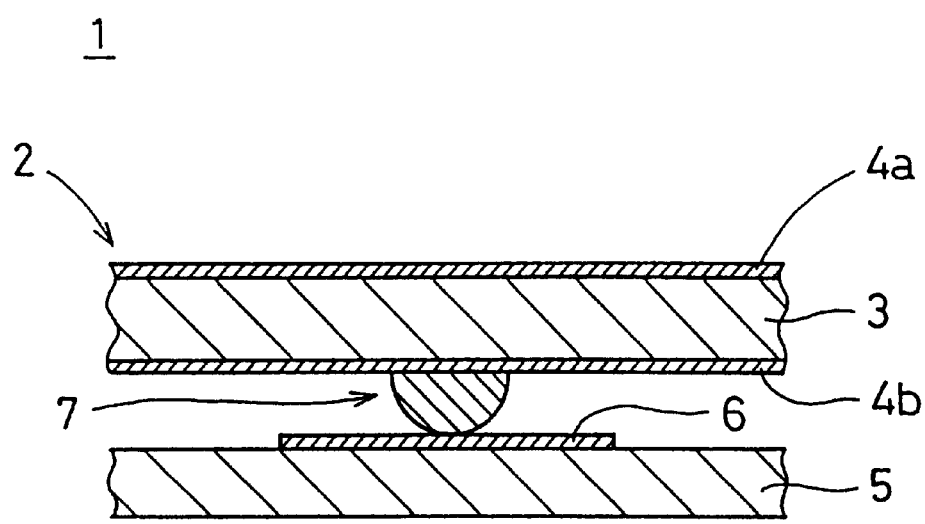
FIG. 16 is a sectional view of an essential portion of a structure for supporting a piezoelectric resonator on a substrate in a conventional piezoelectric component related to the present invention.

FIG. 12 is a plan view of an essential portion of a piezoelectric component 50 which represents a third preferred embodiment of the present invention, FIG. 13 is an exploded perspective view of the portion shown in FIG. 12, and FIG. 14 is an enlarged fragmentary sectional view of the portion shown in FIG. 12. FIG. 15 is a circuit diagram of the piezoelectric component shown in FIGS. 12, 13, and 14. The piezoelectric component 50 described below as the third preferred embodiment is a ladder filter having a ladder type circuit such as that shown in FIG. 15. Members or portions of this piezoelectric component identical or similar to those of the above-described preferred embodiments are indicated by the same reference characters in FIGS. 12, 13, and 14, and are referred to by the same names. Details of such common portions will not be described.

In the piezoelectric component 50, four pattern electrodes 54, 56, 58, and 60 are disposed on an insulating substrate 52. The pattern electrodes 54 to 60 have first to fifth lands arranged in a row in the direction from one end toward the other end of the supporting substrate 52 while being spaced apart from each other. The first land is formed as a portion of the pattern electrode 54, the second and fifth lands are formed as portions of the pattern electrode 56, the third land is formed as a portion of the pattern electrode 58, and the fourth land is formed as a portion of the pattern electrode 60.

A supporting member 62 is attached to the first land. Two supporting members 64 and 66 are attached to the second land; two supporting members 68 and 70 to the third land; and two supporting members 72 and 74 to the fourth land. A supporting member 76 is attached to the fifth land. Each of the supporting members 62 to 76 is bonded to the land by an electroconductive adhesive or the like. The supporting members 62 to 76 are arranged in a row while being spaced apart from each other.

External electrodes 110 and 112 of piezoelectric vibrator elements 100a, 100b, 100c, and 100d used as piezoelectric resonators are attached to the supporting members 62 to 76. In this preferred embodiment, a ladder type circuit such as that shown in FIG. 15 is thereby formed. A metallic cap (not shown) is placed on the supporting substrate 52.

In the piezoelectric component 50 of this preferred embodiment, the supporting members 62 to 76 preferably have the same structure as that of the supporting member 24 described with respect to the preferred embodiment shown in FIGS. 6 and 7, and the piezoelectric vibrator elements 100a to 100d have the same structure as the piezoelectric vibrator element 100.

The structure for supporting the piezoelectric vibrator elements 100a to 100d on the insulating substrate 52 by using the supporting members 62 to 76 is also preferably the same as that in the preferred embodiment shown in FIGS. 6 and 7. The supporting structure will be described with respect to supporting members 66 and 68 by way of example. As shown in FIG. 14, a pair of conductors 86a and 86b formed of a metal foil such as copper foil are respectively formed on two side surfaces of each of the supporting members 66 and 68. The upper surfaces of the supporting members 66 and 68 are respectively connected to the external electrodes 110 and 112 of the piezoelectric vibrator element 100b by elastic electroconductive adhesive layers 88 provided as first bonding and supporting element. The lower surfaces of the supporting members 66 and 68 are respectively connected to the pattern electrodes 56 and 58 of the insulating substrate 52 by elastic electroconductive adhesive layers 90 provided as second bonding and supporting element.

Therefore, the piezoelectric component 50 of this preferred embodiment, shown in FIGS. 12, 13, and 14, operates in the same manner and achieves the same advantages as the piezoelectric component 10 of the preferred embodiment shown in FIG. 6 and 7. In the piezoelectric component 50 shown in FIGS. 12, 13, and 14, since adjacent two of the electrodes of each adjacent pair of the piezoelectric vibrator elements are attached to the two supporting members formed on one land, there is no need for insulation between the two electrodes, and the adjacent pair of the piezoelectric vibrator elements can be disposed close to each other. The piezoelectric vibrator elements cannot be so close to each other if they are mounted by the mounting structure of the piezoelectric component 10 shown in FIGS. 6 and 7. Thus, the piezoelectric component 50 shown in FIGS. 12, 13, and 14 can be smaller in overall size.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A piezoelectric component comprising:
a substrate;
at least one piezoelectric resonator disposed at a predetermined position on a surface of said substrate;
means for driving the at least one piezoelectric resonator for vibrating the least one piezoelectric resonator in a longitudinal mode along a longitudinal axis of the at least one piezoelectric resonator so as to produce a vibration node at an approximate central portion along the longitudinal axis of the at least one piezoelectric resonator;
a supporting member provided between said substrate and said piezoelectric resonator;
a first bonding and supporting element provided between said piezoelectric resonator and said supporting member to bond said piezoelectric resonator and said supporting member to each other; and
a second bonding and supporting element provided between said supporting member and said substrate to bond said supporting member and said substrate to each other; wherein
said supporting member, said first bonding and supporting element and said second bonding and supporting element are located at the vibration node at the approximate central portion along the longitudinal axis of the at least one piezoelectric resonator.

2. A piezoelectric component according to claim 1, wherein said piezoelectric resonator includes an integral base member containing a plurality of piezoelectric layers and a plurality of electrodes disposed between said plurality of piezoelectric layers.

3. A piezoelectric component according to claim 1, wherein said first bonding and supporting element comprises an elastic electroconductive adhesive.

4. A piezoelectric component according to any one of claim 1, wherein each of said first and second bonding and supporting elements comprises a layer of an elastic electroconductive adhesive.

5. A piezoelectric component according to claims 1, wherein said supporting member includes a conductive portion for electrical conduction between said piezoelectric resonator and said substrate.

6. A piezoelectric component according to claim 5, wherein said conductive portion is formed by forming a metal foil such as copper foil on a portion of said supporting member other than flat surfaces respectively facing said substrate and said piezoelectric resonator.

7. A piezoelectric component according to claim 1, wherein a bonding length of said first bonding and supporting element along a longitudinal direction of said piezoelectric resonator is set to about 25% or less of a length of said piezoelectric resonator in the longitudinal direction.

8. A piezoelectric component according to claim 1, wherein said at least one piezoelectric resonator has a shape of a substantially rectangular block.

9. A piezoelectric component according to claim 1, further comprising a plurality of said piezoelectric resonators being arranged in a ladder arrangement so as to define a ladder type filter.

10. A piezoelectric component according to claim 9, further comprising a plurality of said supporting members, a plurality of said first bonding and supporting elements and a plurality of said second bonding and supporting elements being arranged such that each of said first bonding and supporting elements are provided between a respective one of said plurality of piezoelectric resonators and said plurality of supporting members to bond said plurality of piezoelectric resonators and said plurality of supporting members to each other and said plurality of second bonding and supporting elements are provided between said plurality of supporting members and said substrate to bond said plurality of supporting members and said substrate to each other.

11. A piezoelectric component comprising:
a substrate;

at least one piezoelectric resonator disposed at a predetermined position on a surface of said substrate;

means for driving the at least one piezoelectric resonator for vibrating the least one piezoelectric resonator in a longitudinal mode along a longitudinal axis of the at least one piezoelectric resonator so as to produce a vibration node at an approximate central portion along the longitudinal axis of the at least one piezoelectric resonator; and a first bonding and supporting element provided between said substrate and said piezoelectric resonator to support said piezoelectric resonator on said substrate by bonding; wherein said first bonding and supporting element is located at the vibration node at the approximate central portion along the longitudinal axis of the at least one piezoelectric resonator;

a bonding length of said first bonding and supporting element along a longitudinal direction of said piezoelectric resonator is set to about 25% or less of a length of said piezoelectric resonator.

12. A piezoelectric component according to claim 11, wherein said piezoelectric resonator includes an integral base member containing a plurality of piezoelectric layers and a plurality of electrodes disposed between said plurality of piezoelectric layers.

13. A piezoelectric component according to claim 11, wherein said first bonding and supporting element comprises an elastic electroconductive adhesive.

14. A piezoelectric component according to claim 11, further comprising a second bonding and supporting element provided between said supporting member and said substrate to bond said supporting member and said substrate to each other.

15. A piezoelectric component according to claim 14, wherein each of said first and second bonding and supporting elements comprises a layer of an elastic electroconductive adhesive.

16. A piezoelectric component according to claims 11, wherein said supporting member includes a conductive portion for electrical conduction between said piezoelectric resonator and said substrate.

17. A piezoelectric component according to claim 16, wherein said conductive portion is formed by forming a metal foil such as copper foil on a portion of said supporting member other than flat surfaces respectively facing said substrate and said piezoelectric resonator.

18. A piezoelectric component according to claim 11, wherein said at least one piezoelectric resonator has a shape of a substantially rectangular block.

19. A piezoelectric component according to claim 11, further comprising a plurality of said piezoelectric resonators being arranged in a ladder arrangement so as to define a ladder type filter.

20. A piezoelectric component according to claim 19, further comprising a plurality of said supporting members, a plurality of said first bonding and supporting elements and a plurality of said second bonding and supporting elements being arranged such that each of said first bonding and supporting elements are provided between a respective one of said plurality of piezoelectric resonators and said plurality of supporting members to bond said plurality of piezoelectric resonators and said plurality of supporting members to each other and said plurality of second bonding and supporting elements are provided between said plurality of supporting members and said substrate to bond said plurality of supporting members and said substrate to each other.

* * * * *